United States Patent [19]

Lawrenson et al.

[11] Patent Number: 4,513,543

[45] Date of Patent: Apr. 30, 1985

[54] TREATMENT OF COATED GLASS

[75] Inventors: Jack Lawrenson; Kevin M. Murphy, both of Merseyside, England

[73] Assignee: Pilkington Brothers P.L.C., St. Helens, England

[21] Appl. No.: 477,652

[22] Filed: Mar. 22, 1983

[30] Foreign Application Priority Data

Mar. 30, 1982 [GB] United Kingdom ................ 8209351

[51] Int. Cl.³ ............................................. B24D 11/00
[52] U.S. Cl. .................................... 51/283 R; 51/307;
51/298; 51/DIG. 19; 428/209; 428/210;
428/433
[58] Field of Search ............. 428/209, 210; 51/283 R,
51/307, 298, DIG. 19

[56] References Cited

U.S. PATENT DOCUMENTS

| 96,217 | 10/1869 | Frazer | 428/209 |
| 125,726 | 4/1872 | Davis | 428/210 X |
| 4,175,931 | 11/1979 | Teschner et al. | 51/298 X |

FOREIGN PATENT DOCUMENTS 494034  6/1953  Canada ................................. 51/298

OTHER PUBLICATIONS

Condensed Chemical Dictionary, pp. 706-707, ninth edition.

Primary Examiner—George F. Lesmes
Assistant Examiner—Nancy A. B. Swisher
Attorney, Agent, or Firm—Burns, Doane, Swecker & Mathis

[57] ABSTRACT

A metallic layer is removed from a coated glass surface (3) by subjecting the coated glass to the abrasive action of a stripping wheel (7) comprising a particulate abrasive in a porous matrix of polyvinyl formal.

6 Claims, 1 Drawing Figure

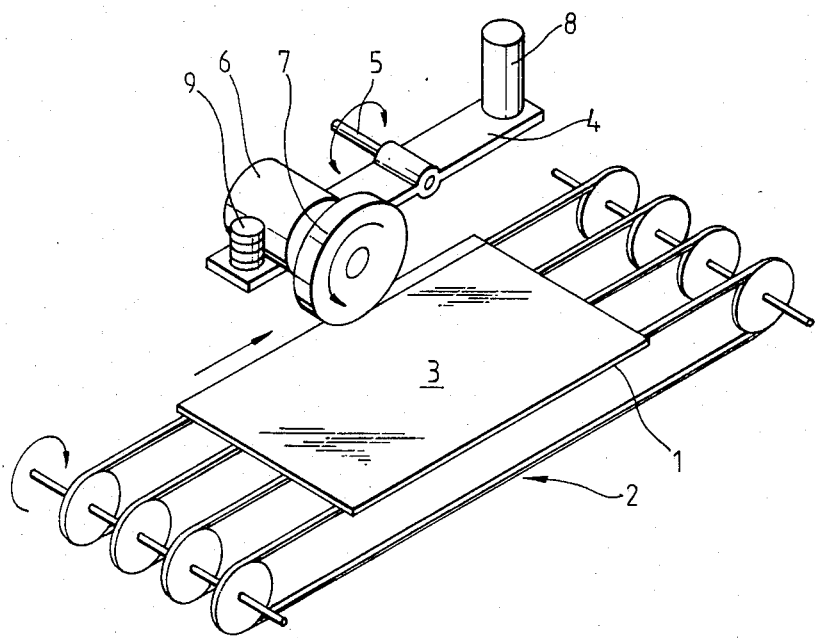

TREATMENT OF COATED GLASS

This invention relates to the treatment of coated glass, and in particular to at least partially removing a metallic coating layer from a coated glass surface.

It is known to embody in multiple glazing units glass sheets having a coating which reflects long-wave infra-red radiation incident on the glass, whilst allowing short-wave infra-red radiation and visible radiation to pass through the glass. One such coating may include a copper layer and a protective layer of tin oxide and/or titanium oxide.

When embodying such coated glass sheets in multiple glazing units, it has been found desirable to remove at least partially the coating from a marginal band of the coated glass surface in order to obtain a good edge seal. One sealing method which is employed is described in Canadian Pat. No. 1,055,682 for the manufacture of a multiple-glazed window unit having a heat-cured peripheral seal produced by curing by radiant heat a dark-coloured, heat-curable sealing material, for example black polysulphide rubber.

It has been found that the edge seals produced when the sealing material is applied directly to the metallic coating on a glass surface, may have weaknesses due to bonding deficiencies, and that the efficiency of bonding to produce good edge seals can be greatly increased by preparing the coated glass sheet by subjecting a marginal band of the coated surface of the sheet to the action of an abrasive material.

By removing the metallic layer, although not necessarily removing underlying oxide layers, the efficiency of sealing is greatly enhanced. Sealing problems remain however when there is a metallic residue on the treated glass surface.

Many abrasive materials have been tried, usually in the form of an abrasive wheel. For example the following wheel types were tried:

1. A flap wheel comprising a NYLON (Trade Mark) matrix in the form of radial flaps with aluminium oxide or silicon carbide abrasive.
2. A convolute wheel comprising NYLON (Trade Mark) matrix convolutely wound to form the wheel and incorporating an aluminium oxide or silicon carbide abrasive.
3. A wheel formed from NYLON (Trade Mark) sheets incorporating aluminium oxide or silicon carbide abrasive and bonded together to form a laminated board from which wheels are punched.
4. A diamond wheel comprising diamond dust abrasive in an epoxy resin.
5. A composition wheel comprising aluminium oxide or silicon carbide abrasive bonded into natural or synthetic rubber, sometimes with sisal or similar reinforcing fibres.

However, it was found that the seals obtained from coated glass panes abraded with these wheels were unsatisfactory, and the deficiencies were traced to very small amounts of metal of the metallic coating layer and small amounts of nitrogen-containing organic matter remaining on the abraded surface.

The efficacy of these wheels was assessed in terms of the treatment of a glass surface having a coating including metallic copper. The assessment was in terms of residual copper measured in $mg/m^2$, and residual nitrogen in atomic %. The residual nitrogen gives an indication of the level of organic matter at the stripped surface, which organic matter may originate from the abrasive material.

Both residual metal and any such organic matter are likely to constitute a weak link in an eventual edge seal. Upper limits of acceptability were set at 10 $mg/m^2$ of residual copper and 2% organic nitrogen.

Most of the wheel types set out above failed to satisfy this requirement, as set out in the comparative table at the end of this description. Additionally some of the wheel types were unsuitable because of high wear rates of the abrasive material, scratching of the glass, and bouncing at acceptable speeds of traverse of the glass against the wheel due possibly to the rigidity of the wheel material.

Further some of the wheels were most effective when used in conjunction with a water spray directed at the stripping area. However the presence of water during the edge treatment can lead to deterioration of the coating on the glass surface.

For good results therefore it was found that a number of points were important, as follows:
1. Dry working.
2. Low metallic residue.
3. Low residual organic nitrogen.
4. Acceptable speed of traverse of the glass sheet relative to the stripping material.

It was found that a selected class of stripping materials were particularly suitable for satisfying these requirements, and the invention provides a method of removing a metallic coating layer from a coated glass surface, comprising subjecting the coated glass surface to the abrasive action of a stripping material comprising particulate abrasive in a porous matrix of polyvinyl formal.

More particularly the invention comprises subjecting the coated glass surface to the abrasive action of a rotating stripping wheel comprising fused alumina abrasive grit in a porous matrix of polyvinyl formal.

For preparing a coated glass sheet which is to be edge-sealed into a multiple glazing unit, a marginal band of the coated glass surface is subjected to the abrasive action of the stripping material to prepare the sheet for edge sealing.

The invention also comprehends a coated glass sheet which has been treated by the method of the invention, in particular a sheet whose coated surface has a marginal band which has been treated by the method of the invention.

An embodiment of the invention will now be described, by way of example, with reference to the accompanying drawing which illustrates diagrammatically, by way of example, the removal of a metallic coating from one margin of a coated glass sheet by the method of the invention.

Referring to the drawing, a sheet of glass 1 which is to be edge-sealed into a multiple glazing unit, is placed on a variable speed conveyor 2, with the coated surface 3 of the glass uppermost. The coating 3 is a multi-layer coating which comprises for example the following layers:
1. A tin oxide layer on the glass surface.
2. A layer of titanium oxide on the tin oxide layer.
3. A copper layer.
4. A second titanium oxide layer on the copper layer.
5. An outer protective tin oxide layer.

Layers 1 and 2 serve to promote adhesion of the copper layer to the glass, and layers 4 and 5 protect the copper layer.

The purpose of the invention is to remove at least the copper layer, but total removal of the underlying titanium oxide and tin oxide layers is not essential.

The total thickness of the coating may be 110 nm, and removal of the top 60 nm of this coating would ensure removal of the copper layer.

Mounted above one edge of the conveyor 2 is a pivoting wheel head 4 on a shaft 5. One arm of the head 4 carries an electric motor 6 on whose output shaft a rotating stripping wheel 7 is mounted for rotation at a linear surface speed of 5 to 40 m/s. The wheel head is positioned through an abutment 8 which bears against an adjustable cam, not shown, due to the action of weights 9 which are used to load the weighting of the wheel 7 on to the glass surface. A load of 2 Kg may be applied by the weights 9 to ensure that in the time taken by the sheet to traverse beneath the wheel, a required depth is stripped from the surface layers of the coating 3.

The wheel is an abrasive wheel of resilient material comprising fused alumina abrasive grit in a porous matrix of polyvinyl formal. Suitable wheels are Kanebo PVA Woodworking Wheels, of outside diameter 200 mm, made by Kanebo Synthetic Chemicals Limited, of 3-80, Tombuckicko 1-Chome, Miyakojima-Ku, Osaka 534, Japan.

The position of the glass sheet 1 on the conveyor 2 was adjusted so that a material band of the coated surface 13 mm wide was subjected to the abrasive action of the cylindrical outer surface of the wheel 7.

The motor 6 was set to give a linear surface speed of the wheel 7 of approximately 30 m/s. The speed of the conveyor was 0.17 m/s.

After treatment the abraded surface was tested for copper by atomic absorption spectroscopy. The average copper level was 2 mg/m$^2$. The wheel ran without bounce or "judder" and there was no observable scratching of the glass.

Each margin of the coated glass surface was treated in the same way and the treated marginal band around the glass sheet was substantially free from metallic material and was suitable for edge-sealing in the manner described above. High quality edge seals were produced without weaknesses which had been observed hitherto.

The method has also been used for at least partially removing coatings which include layers of other metals, for example silver and gold layers.

The advantageous selection, as stripping material, of a porous matrix of a polyvinyl formal as a carrier for particulate abrasive is illustrated in the following table which sets out results obtained using the five wheels, referred to above, which were found to be unsatisfactory, and a wheel according to the invention. In each case, the linear surface speed of the wheel was approximately 30 m/s and the conveyor speed was 0.17 m/s. The results are in terms of residual copper and residual organic nitrogen, when each wheel had been used to strip a copper coating of the kind also referred to above, and the abraded surface had been examined by atomic absorption spectroscopy for residual copper and electron spectroscopy for chemical analysis for residual nitrogen.

| Wheel Type | Composition | Residual Copper (mg/m$^2$) | Residual Nitrogen (atomic %) |
|---|---|---|---|
| 1. | NYLON (Trade Mark) flap wheel with abrasive | 27 | 0 |
| 2. | NYLON (Trade Mark) convolute with abrasive | 23 | : |
| 3. | NYLON (Trade Mark) laminate with abrasive | 7 | : |
| 4. | Diamond Wheel | 11 | nil |
| 5. | Rubber/abrasive composition wheel | 2 | nil |
| 6. | Polyvinyl formal matrix with abrasive | 2 | nil |

Wheel No. 5, the composition wheel comprising particulate abrasive bonded into rubber gave satisfactory results in terms of the residual copper and residual nitrogen at the stripped surface, but was unsatisfactory because it was too hard and rigid and was inclined to bounce.

The test procedure, as described above, was repeated using the wheel in accordance with the invention to abrade a glass surface bearing a coating consisting of a layer of silver sandwiched between two layers of metal oxide. A satisfactory result was obtained, with the abraded surface having a residual silver content of 2 mg/m$^2$ and no residual nitrogen.

What is claimed is:

1. A method of removing a metallic coating layer from a coated glass surface, comprising subjecting the metallic coating layer to the abrasive action of a surface of a stripping material which surface comprises a particulate abrasive carried in a porous matrix of polyvinyl formal.

2. A method according to claim 1 of removing a copper coating layer from a coated glass surface, comprising subjecting the copper coating layer to an abrasive action of a surface of a stripping material which surface comprises a particulate abrasive carried in a porous matrix of polyvinyl formal to remove the copper coating layer with no more than 10 mg/m$^2$ of residual copper and no more than 2% of residual organic nitrogen remaining on the glass surface.

3. A method of removing a metallic coating layer from a coated glass surface, comprising subjecting the metallic coating layer to the abrasive action of the surface of a rotating stripping wheel which surface comprises fused alumina abrasive grit carried in a porous matrix of polyvinyl formal.

4. A method of preparing a coated glass sheet having a metallic coating layer which sheet is to be edge-sealed into a multiple glazing unit, comprising subjecting a marginal band of the metallic coating layer to the abrasive action of a surface of a stripping material which surface comprises a particulate abrasive carried in a porous matrix of polyvinyl formal, to prepare the sheet for edge-sealing.

5. A method according to claim 4, comprising subjecting the marginal band of the metallic coating layer to the abrasive action of the surface of a rotating stripping wheel which surface comprises fused alumina abrasive grit carried in a porous matrix of polyvinyl formal.

6. A method according to claim 5 of preparing a coated glass sheet which is to be edge-sealed into a multiple glazing unit, comprising subjecting a marginal band of a copper coating layer to the abrasive action of a rotating stripping wheel whose surface comprises fused alumina abrasive grit carried in a porous matrix of polyvinyl formal to remove the copper coating layer with no more than 10 mg/m$^2$ of residual copper and no more than 2% of residual organic nitrogen remaining on the abraded material band of the glass surface, the rotating stripping wheel when rotating at a linear surface speed of 5 to 40 m/s, running without bounce.

* * * * *